United States Patent
Breit et al.

(10) Patent No.: US 6,836,125 B2
(45) Date of Patent: Dec. 28, 2004

(54) METHOD AND A DEVICE FOR TESTING A POWER MODULE

(75) Inventors: Fabrice Breit, Plateau la Laurence (FR); Sorin Dinculescu, rue Saint Antoine du T. (FR); Emmanuel Dutarde, rue de la Bareille (FR); Thierry Lebey, rue Ritay (FR); José Saiz, Rue Jacques Prévert (FR)

(73) Assignee: Alstom, Paris (FR)

( * ) Notice: Subject to any disclaimer, the term of this patent is extended or adjusted under 35 U.S.C. 154(b) by 259 days.

(21) Appl. No.: 10/200,191

(22) Filed: Jul. 23, 2002

(65) Prior Publication Data

US 2003/0025522 A1 Feb. 6, 2003

(30) Foreign Application Priority Data

Aug. 2, 2001 (FR) .............................................. 01 10388

(51) Int. Cl.[7] ........................ G01N 27/00; G01R 31/26
(52) U.S. Cl. ........................................ 324/557; 324/768
(58) Field of Search ........................ 324/557, 765–769, 324/158.1; 307/113, 115; 257/690, 692

(56) References Cited

U.S. PATENT DOCUMENTS

| | | | | |
|---|---|---|---|---|
| 5,523,620 A | * | 6/1996 | Eytcheson et al. | 257/690 |
| 6,054,765 A | * | 4/2000 | Eytcheson et al. | 257/724 |
| 6,300,878 B1 | * | 10/2001 | Galloway et al. | 340/642 |
| 6,388,344 B1 | * | 5/2002 | Klotz et al. | 307/113 |

* cited by examiner

*Primary Examiner*—Minh N. Tang
(74) *Attorney, Agent, or Firm*—Sughrue Mion, PLLC

(57) ABSTRACT

A method of testing a power module including a control gate, an emitter, a collector, at least one power component on a dielectric substrate and a diode connected in antiparallel with the power component measures partial discharges occurring between the emitter and the collector when an alternating current voltage source superimposed on a direct current voltage source is connected between the collector and the emitter of the power module. The voltage $V_{test}$ received by the power module between the collector and the emitter verifies at all times the condition $V_{test} > 0$ so that the diode never conducts. The power component is maintained in a turned off state during the test by a direct current voltage source connected between the control gate and the emitter.

7 Claims, 3 Drawing Sheets

METHOD AND A DEVICE FOR TESTING A POWER MODULE

BACKGROUND OF THE INVENTION

1. Field of the Invention

The invention relates to a method of testing a power module and more particularly to a test method for verifying the correct status of the insulation of a power module. The invention applies in particular to testing power modules for onboard power converters on rail vehicles. The invention also concerns a device for implementing the test method according to the invention.

2. Description of the Prior Art

International Electrotechnical Commission (IEC) Standard 1287-1 discloses a method of testing onboard power converters on rail vehicles whose object is to verify the correct status of the insulation of a completely assembled converter. In that method, the main terminals of the converter and the collectors, emitters and gates controlling all the semiconductor components are connected together. The level of partial discharges is then measured when an alternating current voltage or a direct current voltage is applied between the interconnected terminals and the metal baseplate supporting the dielectric substrate supporting the components of the power module.

This kind of test method has the drawback that it tests only the insulation associated the substrate, which represents only a portion of the dielectric stack used in the power module, the insulation associated with the encapsulation of the components, for example, not being tested.

Also, one object of the present invention is therefore to propose a simple and economical method of testing a power module able to detect partial discharge problems in the dielectric gel covering the power components, between the power terminals, or at the interface between the various dielectric materials.

SUMMARY OF THE INVENTION

To this end, the invention provides a method of testing a power module including a control gate, an emitter, a collector, at least one power component on a dielectric substrate and a diode connected in antiparallel with the power component, which method measures partial discharges occurring between the emitter and the collector when an alternating current voltage source superimposed on a direct current voltage source is connected between the collector and the emitter of the power module, the voltage $V_{test}$ received by the power module between the collector and the emitter verifies at all times the condition $V_{test}>0$ so that the diode never conducts, and the power component is maintained in a turned off state during the test by means of a direct current voltage source connected between the control gate and the emitter.

According to another feature of the invention a power module includes a plurality of emitters, a plurality of collectors, a common control gate, a plurality of power components connected in parallel, and a diode connected in antiparallel with each power component, which method measures partial discharges occurring between the emitters, which are electrically connected to each other, and the collectors, which are electrically connected to each other, when an alternating current voltage source superposed on a direct current voltage source is connected between the emitters and the collectors of the power module, the voltage $V_{test}$ received by the power module between the collectors and the emitters verifies at all times the condition $V_{test}>0$ so that the diodes never conduct, and the power modules are maintained during the test in the turned off state by means of a direct current voltage source connected between the common control gate and the emitters.

According to another feature of the invention the power components are Insulated Gate Bipolar Transistors (IGBT).

The invention also provides a device for testing a power module for implementing the method previously described and which includes two terminals adapted to be connected to an alternating current voltage source superposed on a direct current voltage source and means for measuring partial discharges between the two terminals, and in which the voltage $V_{test}$ between the terminals verifies at all times the condition $V_{test}>0$.

According to another feature of the invention the two terminals are adapted to be connected to a direct current voltage generator in series with an alternating current voltage generator.

According to another feature of the invention the two terminals are adapted to be connected to a direct current voltage generator in parallel with an alternating current voltage generator.

According to another feature of the invention the power supply terminal are respectively connected to a first circuit for connecting together the various collectors of the power module and a second circuit for connecting together the various emitters of the power module.

The aims, aspects and advantages of the present invention will become clearer from the following description of one particular embodiment of the invention, which description is given by way of non-limiting example only and with reference to the accompanying drawings.

DETAILED DESCRIPTION OF THE PREFERRED EMBODIMENTS

Figure 2:
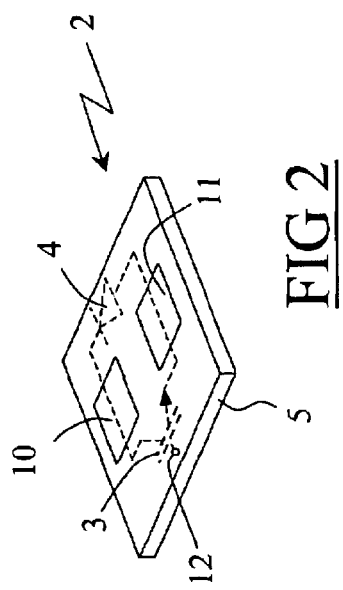
FIG. 2 shows diagrammatically and in isolation a power component of the power module shown in FIG. 1 in the form of an IGBT.

To facilitate reading the drawing, only the components necessary to understanding the invention have been shown. The same components are identified by the same reference numbers in the various figures.

Figure 1:
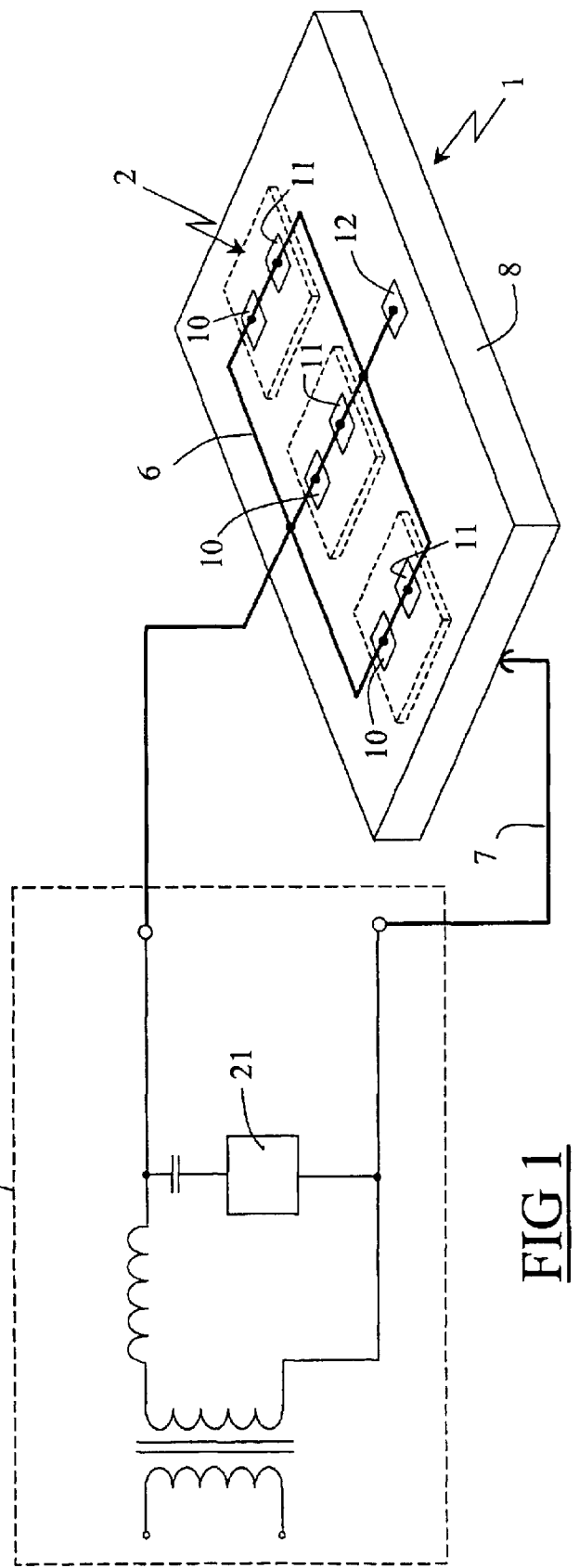
FIG. 1 is a diagrammatic view of a power module tested by the test method according to IEC Standard 1287-1.

FIG. 1 shows a power module 1 for an onboard power converter on a rail vehicle being tested in accordance with a prior art method conforming to IEC Standard 1287-1.

The power module 1 being tested includes three power components 2 connected electrically in parallel and supported on a metal baseplate 8. Each power component 2, shown separately and in more detail in FIG. 2, includes a dielectric substrate 5 which supports an IGBT 3 and an associated diode 4 connected in antiparallel, the diode 4 making the current within the module 1 reversible. The IGBT 3 and the diodes 4 are conventionally covered with dielectric gel.

Each IGBT 3 has a collector 10, an emitter 11 and a conventional control gate 12 for turning it on and off. The control gates 12 of the three IGBT 3 are connected together to represent a common terminal, disposed laterally on the power module 1 shown in FIG. 1, for controlling the state (on or off) of the three IGBT 3.

In the test method according to IEC Standard 1287-1, all the connections of the power module, namely the collectors 10, the emitters 11 and the control gate terminal 12 are connected together by a first circuit 6. A voltage is then applied by means of a test device 20 between the first circuit 6 and a second circuit 7 in contact with the metal baseplate 8. In the example shown, the device 20 supplies an alternating current voltage. The level of discharge is simultaneously measured between the first circuit 6 and the second circuit 7 by means of a measuring instrument 21. This kind of test method has the drawback that it tests only the insulation associated with the dielectric substrates 5.

Figure 3:
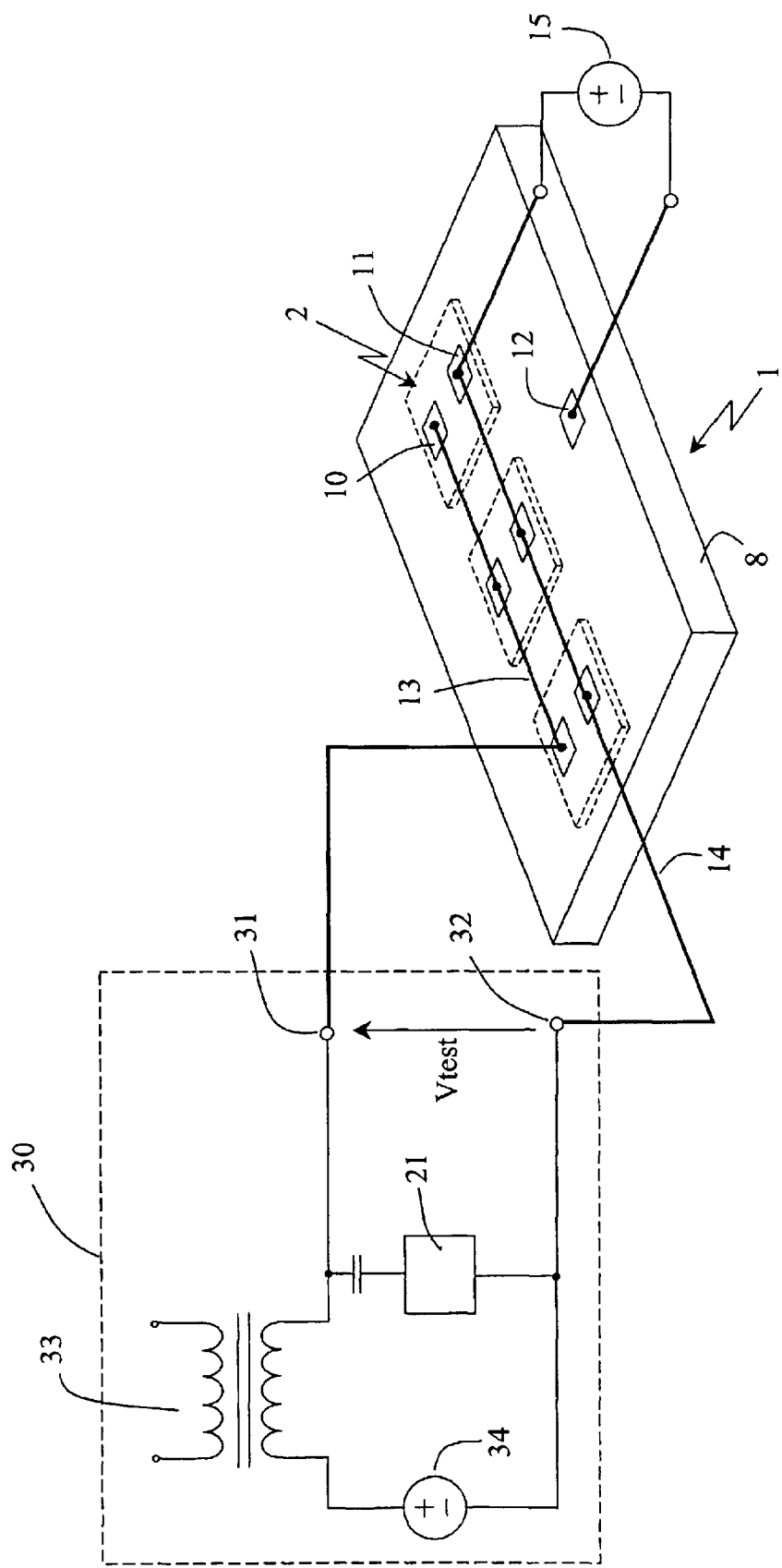
FIG. 3 is a diagrammatic view of the power module shown FIG. 1 being tested by means of a first embodiment of a test device according to the invention.

FIG. 3 shows the power module 1 shown in FIG. 1 being tested by one particular embodiment of a test method according to the invention. In this figure, the collectors 10 of the power module are electrically connected together by means of a first circuit 13 which is connected to a first terminal 31 of a test device 30. The emitters 11 of the power module 1 are electrically connected together by means of a second circuit 14 which is connected to a second terminal 32 of the test device 30, the latter including between the two terminals 31, 32 an alternating current voltage generator 33 in series with a direct current voltage generator 34. The values of the voltages of the alternating current voltage generator 33 and the direct current voltage generator 34 are such that the voltage $V_{test}$ between terminals 31 and 32 at all times satisfies the condition $V_{test}>0$ so that the power module is tested at a variable voltage that is never negative; this is in order to prevent the diodes 4 conducting, which would make it impossible to measure partial discharges. A direct current voltage is applied by means of a generator 15 between the control gate terminal 12 and the emitters 11, which are connected together by the second circuit 14, to turn off the IGBT 3 of the three power components 2 of the module 1. When all these electrical power supply conditions are verified, partial discharges are measured between the first circuit 13 and the second circuit 14 by means of a conventional measuring instrument 21.

Figure 4:
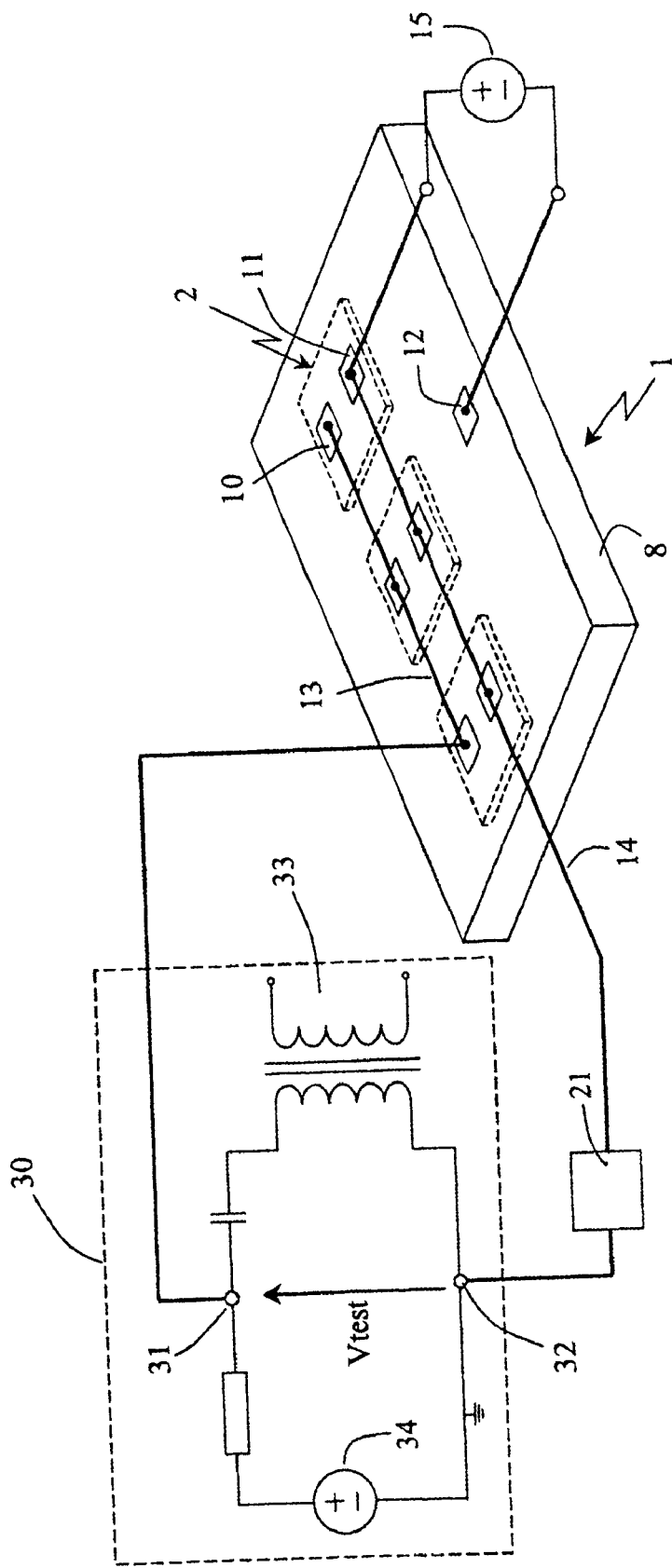
FIG. 4 is a diagrammatic view of the power module shown in FIG. 1 being tested by means of a second embodiment of a test device according to the invention.

FIG. 4 shows a different embodiment of a test device 30 differing from the device shown in FIG. 3 in that the direct current voltage generator 34 is in parallel with the alternating current voltage generator 33 between the terminals 31 and 32, the generators 33 and 34 being rated so that the voltage $V_{test}$ between the terminals 31 and 32 at all times verifies the condition $V_{test}>0$. In this embodiment, the instrument 21 for measuring partial discharges is between the terminal 32 of the test device 30 and the second circuit 14 which is connected to the emitters 11 of the power module. The terminal 31 is still connected directly to the first circuit 13 and the test method remains unchanged compared to that described with reference to FIG. 3.

This kind of test method has the advantage of enabling detection of partial discharges due to the encapsulation of the power components. Accordingly, the test method according to the invention detects partial discharges in the dielectric gel, between the emitter lead wires and the collector metallization, between the power terminals or at the interface between the various dielectric materials, for example at the bond between the gel and the epoxy resin.

Moreover, this test method has the advantage of measuring partial discharges under conditions close to those encountered during actual use of the power module.

This kind of test method, which remains very simple to implement, can advantageously be used to monitor the evolution in time of characteristic parameters of a power module, for the purposes of predictive maintenance.

Of course, the invention is in no way limited to the embodiment described and shown, which is provided only by way of example. It can be modified, in particular from the point of view of the nature of the various components or by substituting technical equivalents, without departing from the scope of the protection afforded to the invention.

There is claimed:

1. A method of testing a power module including a control gate, an emitter, a collector, at least one power component on a dielectric substrate and a diode connected in antiparallel with said power component, which method measures partial discharges occurring between said emitter and said collector when an alternating current voltage source superimposed on a direct current voltage source is connected between said collector and said emitter of said power module, a voltage $V_{test}$ received by said power module between said collector and said emitter verifies at all times the condition $V_{test}>0$ so that said diode never conducts, and said power component is maintained in a turned off state during the testing by means of a direct current voltage source connected between said control gate and said emitter.

2. The method claimed in claim 1 of testing a power module including a plurality of emitters, a plurality of collectors, a common control gate, a plurality of power components connected in parallel, and a diode connected in antiparallel with each power component, which method measures partial discharges occurring between said emitters, which are electrically connected to each other, and said collectors, which are electrically connected to each other, when the alternating current voltage source superposed on the direct current voltage source is connected between said emitters and said collectors of said power components, the voltage $V_{test}$ received by said power components between said collectors and said emitters verifies at all times the condition $V_{test}>0$ so that said diodes never conduct, and said power components are maintained during the test in the turned off state by means of a direct current voltage source connected between said common control gate and said emitters.

3. The method claimed in claim 1 wherein said at least one power component comprises an IGBT.

4. A device for testing a power module for implementing the method claimed in claim 1, which device includes two terminals adapted to be connected to the alternating current voltage source superposed on the direct current voltage source and means for measuring partial discharges between said two terminals, and in which device the voltage $V_{test}$ between said terminals and verifies at all times the condition $V_{test}>0$.

5. The test device claimed in claim 4 wherein said two terminals are adapted to be connected to the direct current voltage source in series with the alternating current voltage source.

6. The test device claimed in claim 4 wherein said two terminals are adapted to be connected to the direct current voltage source in parallel with the alternating current voltage source.

7. The test device claimed in claim 4, wherein the power module includes a plurality of emitters, a plurality of collectors, a common control gate, a plurality of power components connected in parallel, and a diode connected in antiparallel with each power component, wherein said two terminals are respectively connected to a first circuit for connecting together the plurality of collectors of said power module and a second circuit for connecting together the plurality of emitters of said power module.

* * * * *